(12) United States Patent
Servilio et al.

(10) Patent No.: US 7,254,195 B2
(45) Date of Patent: Aug. 7, 2007

(54) APPARATUS, METHODS AND ARTICLES OF MANUFACTURE FOR DYNAMIC DIFFERENTIAL DELAY CORRECTION

(75) Inventors: Robert Servilio, Washington, NJ (US); Carol Moy, Morristown, NJ (US); Christine DiVincenzo, Califon, NJ (US); Yongwen Yang, Hillsboro, NJ (US)

(73) Assignee: M/A-Com, Inc., Lowell, MA (US)

( * ) Notice: Subject to any disclaimer, the term of this patent is extended or adjusted under 35 U.S.C. 154(b) by 722 days.

(21) Appl. No.: 10/647,617

(22) Filed: Aug. 25, 2003

(65) Prior Publication Data

US 2005/0047532 A1    Mar. 3, 2005

(51) Int. Cl.
*H04L 27/08* (2006.01)

(52) U.S. Cl. .................................. 375/345

(58) Field of Classification Search ............ 375/294, 375/296, 327, 371, 373, 375, 376, 298, 345
See application file for complete search history.

(56) References Cited

U.S. PATENT DOCUMENTS

| | | | |
|---|---|---|---|
| 4,534,040 A | 8/1985 | Thapar | 375/39 |
| 4,580,111 A | 4/1986 | Swanson | 332/41 |
| 4,618,999 A * | 10/1986 | Watkinson | 455/108 |
| 4,696,017 A * | 9/1987 | Masheff et al. | 375/296 |
| 4,804,931 A | 2/1989 | Hulick | 332/31 R |
| 4,947,455 A | 8/1990 | Swanson | 455/115 |
| 4,952,890 A | 8/1990 | Swanson | 332/152 |
| 5,056,109 A | 10/1991 | Gilhousen et al. | 375/1 |
| 5,257,283 A | 10/1993 | Gilhousen et al. | 375/1 |
| 5,265,119 A | 11/1993 | Gilhousen et al. | 375/1 |
| 5,267,262 A | 11/1993 | Wheatley, III | 375/1 |
| 5,367,272 A | 11/1994 | Hulick | 332/149 |
| 5,392,007 A | 2/1995 | Cripe | 332/149 |
| 5,396,516 A | 3/1995 | Padovani et al. | 375/225 |
| 5,450,044 A | 9/1995 | Hulick | 332/103 |
| 5,452,473 A | 9/1995 | Weiland et al. | 455/88 |
| 5,469,127 A | 11/1995 | Hulick et al. | 332/149 |
| 5,485,486 A | 1/1996 | Gilhousen et al. | 375/205 |
| 5,524,286 A | 6/1996 | Chiesa et al. | 455/126 |
| 5,590,408 A | 12/1996 | Weiland et al. | 455/69 |
| 5,598,436 A | 1/1997 | Brajal et al. | 375/297 |
| 5,621,351 A | 4/1997 | Puri et al. | 330/10 |
| 5,655,220 A | 8/1997 | Weiland et al. | 455/69 |

(Continued)

FOREIGN PATENT DOCUMENTS

EP    1 217 753 A1    6/2002

(Continued)

*Primary Examiner*—Emmanuel Bayard

(57) ABSTRACT

The invention is directed to a system for dynamically correcting an electromagnetic wave by processing two or more aspects of the electromagnetic wave along two or more separate signal paths; comparing an expected value for at least one of the aspects of the electromagnetic wave with an actual value for the aspect of the electromagnetic wave to generate a correction signal; and applying the correction signal to at least one other aspect of the electromagnetic wave. The aspects of the electromagnetic wave to be processed may be amplitude and phase, where the comparison may be along the phase path and the adjustment along an analog portion of the amplitude path. A digital phase locked loop may be used for the comparison and to generate the correction signal; and a bank of pipeline registers may be used to adjust the amplitude path.

25 Claims, 3 Drawing Sheets

U.S. PATENT DOCUMENTS

| | | | |
|---|---|---|---|
| 5,661,434 A | 8/1997 | Brozovich et al. | 330/51 |
| 5,703,902 A | 12/1997 | Ziv et al. | 375/200 |
| 5,758,269 A | 5/1998 | Wu | 455/127 |
| 5,867,071 A | 2/1999 | Chethik | 332/103 |
| 5,886,573 A | 3/1999 | Kolanek | 350/10 |
| 5,903,554 A | 5/1999 | Saints | 370/342 |
| 5,905,760 A | 5/1999 | Schnabl et al. | 375/296 |
| 5,974,041 A | 10/1999 | Kornfeld et al. | 370/342 |
| 6,041,082 A | 3/2000 | Takeda et al. | 375/300 |
| 6,043,707 A | 3/2000 | Budnik | 330/10 |
| 6,075,974 A | 6/2000 | Saints et al. | 455/69 |
| 6,125,266 A | 9/2000 | Matero et al. | 455/126 |
| 6,147,553 A | 11/2000 | Kolanek | 330/10 |
| 6,160,444 A * | 12/2000 | Horsfall et al. | 329/325 |
| 6,178,313 B1 | 1/2001 | Mages et al. | 455/127 |
| 6,185,432 B1 | 2/2001 | Vembu | 455/522 |
| 6,191,653 B1 | 2/2001 | Camp, Jr. et al. | 330/129 |
| 6,194,963 B1 | 2/2001 | Camp, Jr. et al. | 330/149 |
| 6,255,906 B1 | 7/2001 | Eidson et al. | 330/124 R |
| 6,256,482 B1 | 7/2001 | Raab | 455/108 |
| 6,259,928 B1 | 7/2001 | Vembu | 455/522 |
| 6,272,336 B1 | 8/2001 | Appel et al. | 455/423 |
| 6,275,685 B1 * | 8/2001 | Wessel et al. | 455/126 |
| 6,295,442 B1 * | 9/2001 | Camp et al. | 455/102 |
| RE37,407 E * | 10/2001 | Eisenberg et al. | 330/2 |
| 6,320,913 B1 | 11/2001 | Nakayama | 375/297 |
| 6,330,462 B1 | 12/2001 | Chen | 455/572 |
| 6,351,650 B1 | 2/2002 | Lundby et al. | 455/522 |
| 6,370,109 B1 | 4/2002 | Schwartz et al. | 370/203 |
| 6,374,085 B1 | 4/2002 | Saints et al. | 455/69 |
| 6,377,784 B2 | 4/2002 | McCune | 455/108 |
| 6,381,292 B1 * | 4/2002 | Yamakoshi | 375/376 |
| 6,421,327 B1 | 7/2002 | Lundby et al. | 370/310 |
| 6,449,465 B1 * | 9/2002 | Gailus et al. | 455/126 |
| 6,490,460 B1 | 12/2002 | Soliman | 455/522 |
| 6,512,417 B2 * | 1/2003 | Booth et al. | 330/149 |
| 6,539,068 B2 * | 3/2003 | Hebron et al. | 375/346 |
| 6,621,340 B1 | 9/2003 | Perthold et al. | 330/149 |
| 6,628,165 B1 | 9/2003 | Henderson et al. | 330/85 |
| 6,636,112 B1 | 10/2003 | McCune | 330/10 |
| 6,658,238 B1 | 12/2003 | Ursenbach et al. | 455/102 |
| 6,701,134 B1 | 3/2004 | Epperson | 455/102 |
| 6,703,897 B2 * | 3/2004 | O'Flaherty et al. | 330/149 |
| 6,738,432 B2 | 5/2004 | Pehlke et al. | 375/300 |
| 6,791,417 B2 | 9/2004 | Pengelly et al. | 330/295 |
| 6,799,020 B1 | 9/2004 | Heidmann et al. | 455/103 |
| 6,816,008 B2 | 11/2004 | Kontson | 330/51 |
| 6,834,084 B2 | 12/2004 | Hietala | 375/296 |
| 6,993,087 B2 * | 1/2006 | Rosnell et al. | 375/295 |
| 2002/0071497 A1 * | 6/2002 | Bengtsson et al. | 375/298 |
| 2002/0090921 A1 | 7/2002 | Midtgaard et al. | 455/126 |
| 2002/0098812 A1 | 7/2002 | Sourour et al. | 455/91 |
| 2002/0141510 A1 | 10/2002 | Sridharan et al. | 375/300 |
| 2002/0186783 A1 | 12/2002 | Opas et al. | 375/297 |
| 2002/0193085 A1 | 12/2002 | Mathe et al. | 455/126 |
| 2003/0073419 A1 | 4/2003 | Chadwick | 455/126 |
| 2003/0095608 A1 | 5/2003 | Duperray | 375/297 |
| 2003/0215025 A1 | 11/2003 | Hietala | 375/297 |
| 2003/0215026 A1 | 11/2003 | Hietala | 375/297 |
| 2003/0223510 A1 | 12/2003 | Kurakami et al. | 375/297 |
| 2004/0021517 A1 | 2/2004 | Irvine et al. | 330/151 |
| 2004/0047432 A1 | 3/2004 | Iwasaki | 375/297 |
| 2004/0192369 A1 | 9/2004 | Nilsson | 455/522 |
| 2005/0017801 A1 | 1/2005 | Bachman, II et al. | 330/149 |
| 2005/0030104 A1 | 2/2005 | Chen et al. | 330/295 |
| 2005/0118965 A1 | 6/2005 | Tanabe et al. | 455/127.1 |
| 2005/0122164 A1 | 6/2005 | Brandt et al. | 330/10 |

FOREIGN PATENT DOCUMENTS

| | | |
|---|---|---|
| WO | WO 01/76169 A1 | 10/2001 |

* cited by examiner

APPARATUS, METHODS AND ARTICLES OF MANUFACTURE FOR DYNAMIC DIFFERENTIAL DELAY CORRECTION

FIELD OF THE INVENTION

The invention relates to the transfer of electromagnetic waves. More particularly, the invention relates to a system for processing electromagnetic signals, and more particularly to adjusting for signal propagation delays in systems processing electromagnetic waves.

BACKGROUND OF THE INVENTION

Electromagnetic waves may be transferred from place to place through a conductor. In wired transmission, the conductor is usually a wire or other solid substance. In wireless transmission, the conductor is usually an ambient substance, such as air, water, etc. In wireless connections a transmitter is usually used to transfer a wave and a receiver to receive a wave. A transitive combines the functions of both transmitter and receiver in one system. A transmitter typically converts electrical energy into a signal, which is then broadcast via an antenna to a receiver's antenna. Repeaters, middle stations, etc. May be used as intermediates in the transmission to sustain the integrity of the transmitted wave.

The electrical energy input into a transmitter usually is modulated into a basic transmission or carrier signal by overlaying some intelligence upon the energy—speech, data, etc.—in the form of an information signal, and the receiver typically demodulates the modulated carrier signal, once received, into a copy of the initial intelligence sent by the transmitter.

In order to accomplish their function, transmitters, receivers, and tranceivers are comprised of various building block components. The information signal, for example, may be generated or modulated by one or more transducers, such as a microphone. It may also be generated by a modulator, such as an analog modem. The modulation of the information signal onto the carrier signal may be done by a mixer and the energy or carrier wave itself is usually generated by an oscillator. An amplifier is usually used at one or more places in the transmitter circuitry to boost the signal strength, to provide power to active components, etc. Similarly, one or more filters are usually used as well, to clean up the input signal, the outputted signal, etc. An antenna is used to broadcast the signal, and a power supply will supply power as needed.

All of these system components may introduce delay into the propagation of a signal through the system, which may cause distortion in the signal outputted from the processing system. In some systems, aspects of the electromagnetic wave, such as amplitude and phase information, may be processed along different paths and with difference components. Some of these components may be analog in nature and some digital. Because of this, there may be a difference in delay, or differential delay, between each aspect of the electromagnetic wave when they are recombined, which may cause unwanted distortion in the processed output signal.

Because of drawbacks in conventional systems, it would be desirable to provide more efficient and precise methods and articles of manufacture processing electromagnetic waves in this manner.

SUMMARY OF THE INVENTION

The invention comprises systems, methods and articles of manufacture for transmitting and receiving electromagnetic waves and signals. Embodiments of the invention may incorporate a system for dynamically correcting an electromagnetic wave by processing two or more aspects of the electromagnetic wave along two or more separate signal paths; comparing an expected value for at least one of the aspects of the electromagnetic wave with an actual value for the aspect of the electromagnetic wave to generate a correction signal; and applying the correction signal to another aspect of the electromagnetic wave.

In one embodiment, the aspects of the electromagnetic wave to be processed may be amplitude and phase, where the comparison may be along the phase path and the adjustment along an analog portion of the amplitude path. A digital phase locked loop may be used for the comparison and to generate the correction signal; and a bank of pipeline registers may be used to adjust the amplitude path.

BRIEF DESCRIPTION OF THE DRAWINGS

For the purpose of illustrating the invention, there is shown in the drawings at least one embodiment, which is presently preferred; it being understood, however, that this invention is not limited to the precise arrangements, methods and instrumentalities shown.

DETAILED DESCRIPTION OF THE INVENTION

Figure 1:
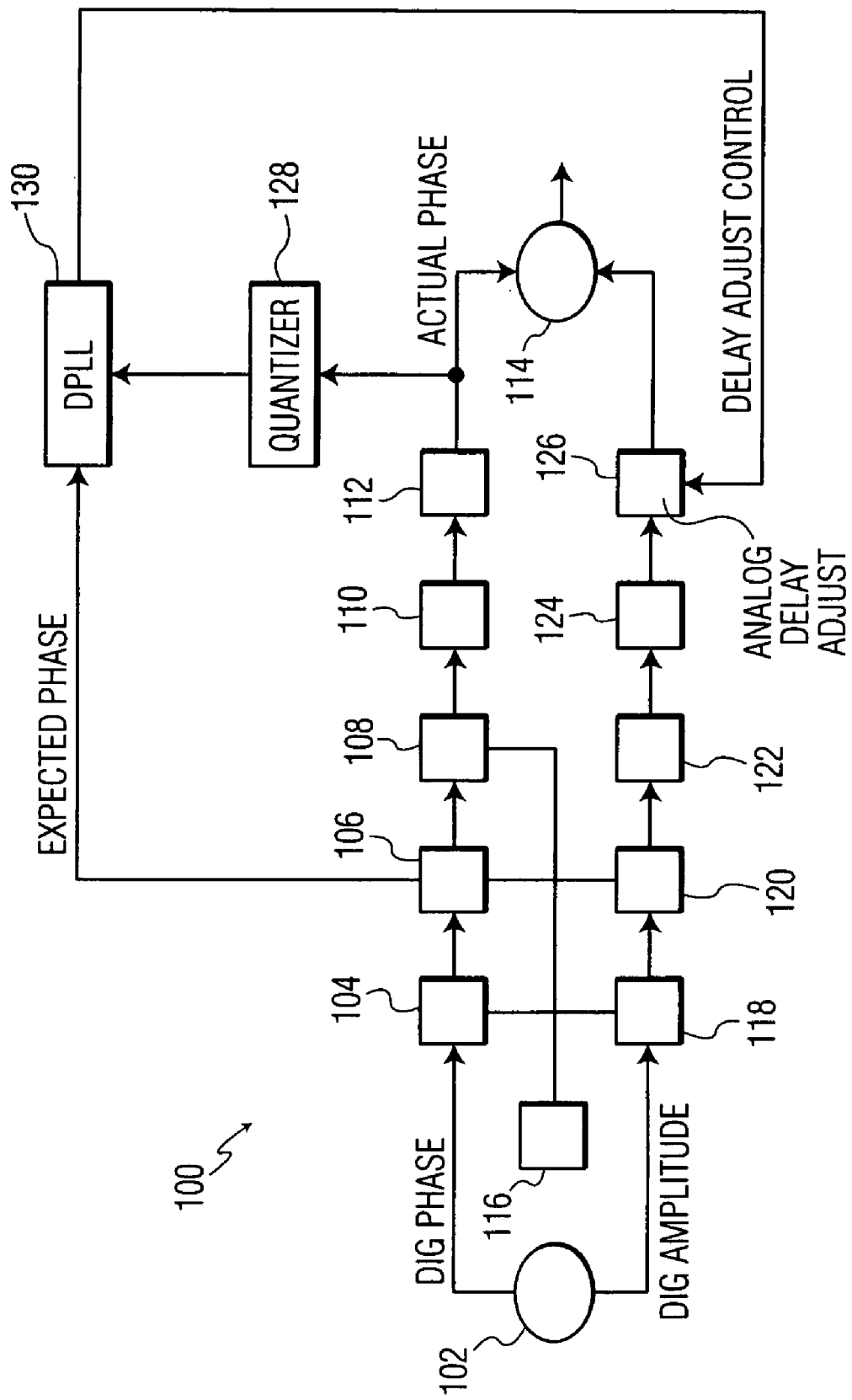
FIG. 1 shows an embodiment of a system for processing an electromagnetic wave.

Embodiments of the invention include apparatus, methods and articles of manufacture for providing signal correction in the processing electromagnetic waves, such as for transmitting and receiving information signals. It should be noted that the word "signal" is used herein to describe an electromagnetic wave that has been modulated in some fashion, usually by the impression of intelligence upon the wave, for example imposing data upon a carrier wave. It should also be noted that the use of "signal" and "wave" in the singular includes the plural (or multiple signals and waves respectively) as often systems for processing electromagnetic waves, such as transmitters, receivers and transceivers, generate more than one signal and/or wave in the normal course of their operation. For example, multiple harmonics of a baseband signal might be desirably generated as in amplitude modulation; multiple frequencies might be generated, etc.

Embodiments of the invention may be entirely comprised of hardware, software and/or may be a combination of software and hardware. Accordingly, individual blocks and combinations of blocks in the drawings support combinations of means for performing the specified functions and/or combinations of steps for performing the specified functions. Each of the blocks of the drawings, and combinations of blocks of the drawings, may be embodied in many different ways, as is well known to those of skill in the art.

FIG. 1 illustrates a generalization of a circuit in which a differential delay may occur between aspects of an electromagnetic wave being processed by a system. As shown in FIG. 1, processing system 100 may include a source of an electromagnetic signal 102, which may provide information regarding aspects of the wave, such as amplitude and phase, out along different signal paths. Each signal path may comprise one or more analog components (110, 112, and 122) and digital signal processing components (104, 106, 108, 118, and 120). Each of the digital processing components may be timed from the same common clock source 116.

For purposes of the embodiment disclosed herein, it will be assumed that the amplitude and phase signals start out time aligned from source 102. However, those of ordinary skill in the art will appreciate that the invention is not limited thereto. Because the amplitude and phase paths require different processing in differing components, the timing of the signals may diverge as the signals traverse the various processing blocks. Thus, when the signals are recombined at recombining circuit 114 the signal may suffer from significant distortion.

For purposes of illustration the phase path is shown as the dominant delay. However, those of ordinary skill in the art will appreciate that the converse is possible as well. If the phase is considered to be the dominant delay, then delay must be added to the amplitude path to equalize the paths. A digital delay adjust component 124 and an analog delay adjust component 126 may be added to perform this delay equalization.

In order for processing system 100 to perform acceptably, the delays should be controlled in accordance with the equation: Phase_delay_total=Amp_delay_total+Digital_Delay_Adjust+Analog_Delay_Adjust. As long as the difference between the left and right sides of this expression is within an acceptable tolerance for the particular processing operation, then the performance of the system will be deemed to be acceptable.

It is also assumed that the delay caused by the digital blocks is determined primarily by clock 116 and is invariant over temperature, processing and voltage to within the tolerance of clock 116, and so may be pre-determined. Also, any clock variability may be assumed to be applicable to both paths and may be normalized out.

Thus, the difference in the amplitude and phase paths due to digital clocking may be easily computed by taking the difference in the number of clock periods each signal takes through each path and then adding this difference to the amplitude path (in this example) using digital delay adjust component 124. The mechanism used for digital delay adjust 124 is not particularly limited, and may comprise, for example, one or more pipeline registers. Digital delay adjust 124 may be hardwired to a fixed delay at the time of design or may be programmable for active adjustment of the delay compensation.

As a result, the major cause of variations in delay over temperature, process, and voltage may be attributable primarily to any analog components in the paths. Variations in the analog component paths may also be detected and compensated for using analog delay adjust 126. Detection of the differential delay may be performed by quantizing the phase signal just prior to the recombining in recombining circuit 126 and then comparing this quantized signal to the desired or expected phase response. In the illustrated embodiment, this may be accomplished using quantizer 128 and digital phase-locked loop (DPLL) 130.

DPLL 130 may be used to perform an alignment of the expected phase and the actual phase signals. DPLL 130 may receive the expected phase signal from an earlier digital processing component, in this example block 106. Quantizer 128 may receive the actual phase signal outputted from analog component 112 and produces a quantized signal representing the actual phase signal for inputting to DPLL 130. DPLL 130 receives this quantized, or sampled actual phase signal from quantizer 128 and produces a delay adjust control signal. The delay adjust control signal may be based upon the magnitude of the delay variation.

Figure 2:
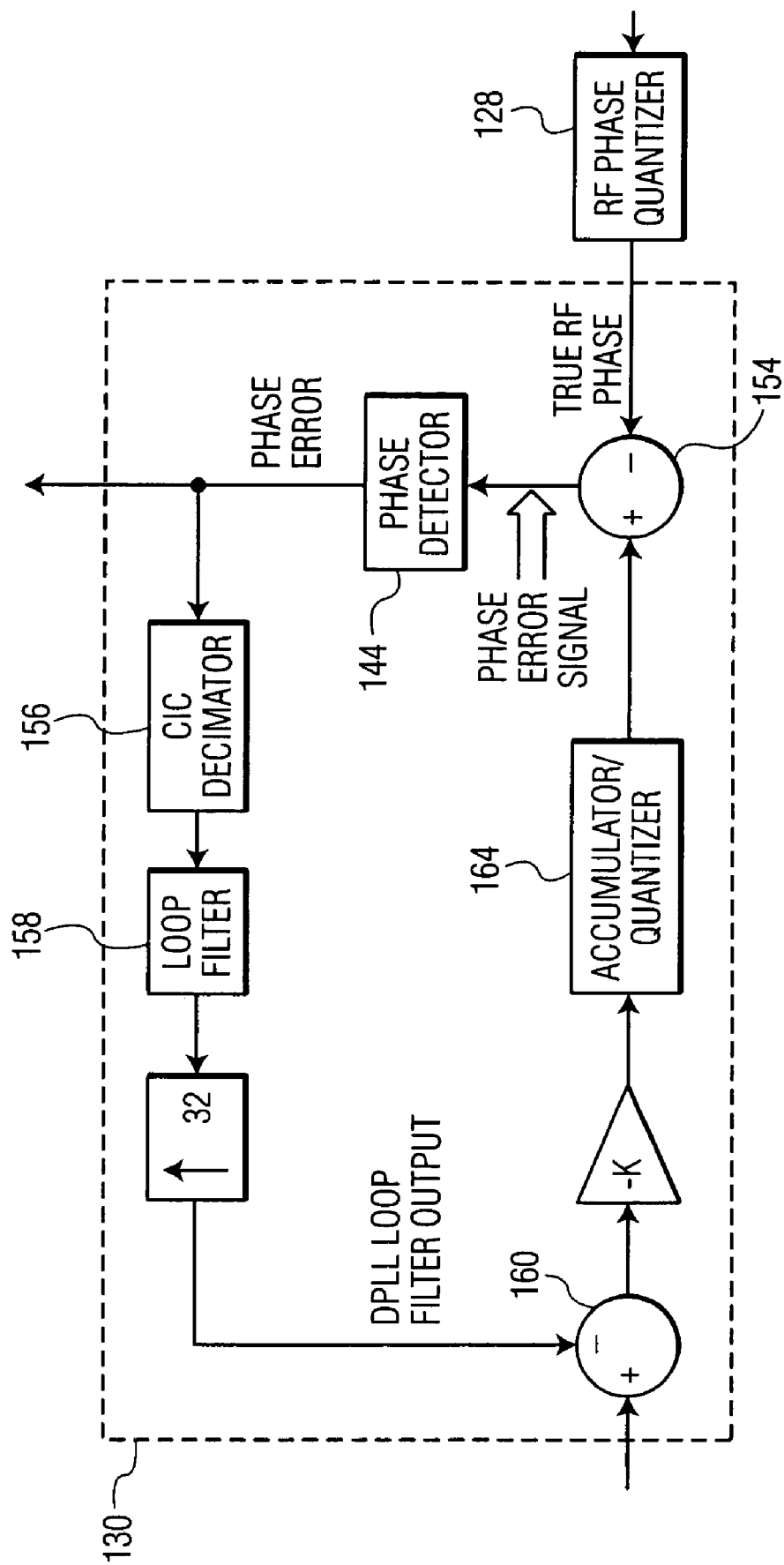
FIG. 2 shows an embodiment of a signal correction circuit.

The manner in which this may be accomplished is not particularly limited. One embodiment is shown in FIG. 2. As shown in FIG. 2, the expected differentiated phase signal may be used to drive a phase accumulator 164 in a conventional manner to produce a reference signal representative of the expected phase for the processed output signal. Those of ordinary skill in the art will appreciate that the number of bits used in phase accumulator 164 is not particularly limited. In the illustrated embodiment, the resolution of phase accumulator 164 (i.e, the number of bits) may be equal to that of quantizer 128.

Quantizer 128, in turn, may be used to sample the actual phase signal. This function may be accomplished in any number of ways, such as by using an A/D converter, which would output a digital signal from quantizer 128 that contains the phase information of the modulated signal. Quantizer 128 may also use a timing signal from clock 116 in a conventional manner. The timing signal from clock 116 may also be incorporated into the digital signal outputted from quantizer 128.

This digital output from quantizer 128 may then be inputted to DPLL 130 for comparison with the expected phase signal. For example, this digital signal may be subtracted from the "ideal" reference phase signal at subtractor 154. Subtractor 154 may digitally subtract these two signals to produce an output that is a phase delay error signal, representative of the difference, or delay error, between the expected phase (which is substantially synchronized with the amplitude signal via clock 116) and the actual phase sampled by quantizer 128.

The delay error signal may then be received by phase detector 144, which may be operated to provide for a direct comparison of the digitally summed expected phase and the actual phase to produce a correction signal representing the amount of correction needed by analog delay adjust component 126.

The output of phase detector 144 may be passed to decimator 156, which may be used to reduce the sample rate of the loop filter in the DPLL. Decimator 156 may comprise, for example, a cascaded integrator-comb filter (CIC) type, but is not limited thereto. Decimator 156 then feeds loop filter 158, which may comprise, for example an FIR filter having a predetermined response calculated for use with the signal being processed. The feedback output signal of loop filter 158 may then be combined with the expected phase signal at subtractor 160.

The delay control signal outputted from DPLL 130 may be received by analog delay adjust block 126, which adds or subtracts the appropriate delay to the amplitude path. Analog delay adjust block 126 is not particularly limited and may comprise any mechanism for adjusting the phase is the signal path, such as a bank of pipeline registers clocked at rate that is set high enough to provide the granularity to bring the amplitude and phase paths into alignment within the tolerance required by processing system 100.

Figure 3:
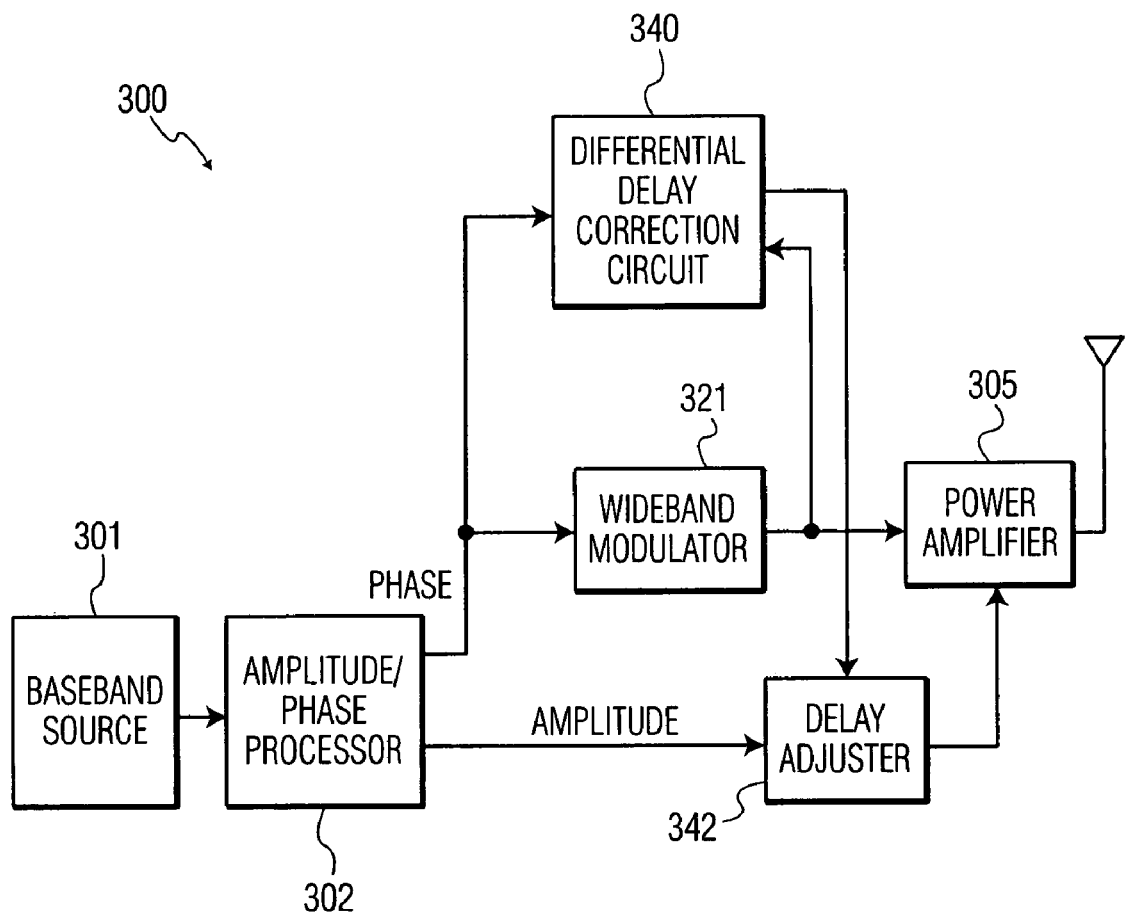
FIG. 3 shows an embodiment of a wave transmitter.

One embodiment of a system for processing an electromagnetic wave incorporating the invention is illustrated in FIG. 3. In this embodiment, a wave transmitter 300 includes a baseband signal source 301 for receiving an input signal that contains intelligence (e.g., voice, data, etc.), an amplitude/phase signal processor 302, wide-band phase modulator 321, differential delay correction circuit 340, delay adjuster 342, power amplifier 305.

A phase modulated carrier wave from wideband phase modulator 321 is passed to differential delay correction circuit 340. A particular embodiment of differential delay correction circuit 340 may be as shown in FIG. 2, as previously described. Differential delay correction circuit 340 quantizes the actual phase signal using quantizer 128 for comparison with the expected phase as received from amplitude/phase signal processor 302. This may be accomplished using DPLL 130, as previously described. DPLL 130 generates a correction signal based upon this comparison. This correction signal may then be passed to delay adjuster 342. As discussed above, delay adjuster 342 is not particularly limited, but may comprise a bank of pipeline registers, for example. Delay adjuster 342 adjusts the delay of amplitude component to reduce or eliminate its differential delay with phase component. In some modulation schemes, such as CDMA for example, it is preferably that the delay tolerance be less than about 10 ns.

While the invention has been described herein in regard to a transmitter, those of ordinary skill in the art will appreciate that the invention is not limited thereto and that other processing systems may be used as well. In some embodiments, a transmitter, receiver, and/or transitive processing system of the invention may be specialized for particular input signals, carrier waves and output signals, e.g. various types of cell phones, such as CDMA, CDMA2000, W-CDMA, GSM, TDMA, as well as various other types of devices, both wired and wireless, e.g. Bluetooth, 802.11a, -b, -g, GPS, radar, 1xRTT, radios, GPRS, computers and computer communication devices, handheld devices, etc. Among the modulation schemes supported by the invention are: GMSK, which is used in GSM; GFSK, which is used in DECT & Bluetooth; 8-PSK, which is used in EDGE, OQPSK & HPSK, which are used in IS-2000; p/4 DQPSK, which is used in TDMA; and OFDM, which is used in 802.11.

The preferred embodiments utilize both analog and digital components insofar as these embodiments manipulate waves and signals requiring both. For example, cell phone embodiments may utilize both analog and digital components. Various types of system architectures may be utilized for constructing the embodiments. Generally an ASIC composition is used in realizing the various architectures. CMOS and/or BiCMOS fabrication techniques may be used as well as a combination of both, e.g. a BiCMOS Phase modulator area combined with a CMOS baseband area. Generally, in the preferred embodiments, transistor speed is a concern, and BiCMOS provides faster speed. Additionally, BiCMOS provides less current drain than an all CMOS configuration.

The invention improves over the systems of the prior art. The ability to detect amplitude and phase delay mismatch and to adjustment of the delay to align the amplitude and phase paths occurs automatically while in operation substantially reduces expensive calibration time in the factory. This significant benefit is more pronounced since this scheme substantially eliminates the necessity of an embedded host controller, e.g., in a wireless handset, from having to perform a complex algorithm to align the two paths. In conventional systems, this algorithm would have to periodically recalibrate during a wireless phone call to account for significant temperature and voltage variations that can occur within a relatively short periods.

The transmitter of the invention does not include I/Q modulators, but instead preferably uses a polar modulation system. Conventionally, I/Q modulators have been used with linear modulation schemes. Not using such modulators eliminates the problem of I/Q imbalance that occurs when these modulators are used.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A method for dynamically correcting an aspect of an electromagnetic wave being processed, said method comprising the steps of:
  processing two or more aspects of said electromagnetic wave along two or more separate signal paths;
  comparing an expected value for at least one of said aspects of said electromagnetic wave along at least one of said signal paths with an actual value for said aspect of said electromagnetic wave along said at least one signal path to generate a correction signal; and
  applying said correction signal to at least one other aspect of said electromagnetic wave.

2. A method as in claim 1, wherein said two or more aspects of said electromagnetic wave comprise amplitude and phase information for said electromagnetic wave.

3. A method as in claim 1, wherein said aspect of said electromagnetic wave that is compared is phase information for said electromagnetic wave.

4. A method as in claim 1, wherein said step of applying said correction signal to said other aspect of said electromagnetic wave is accomplished by compensating for an analog delay.

5. A method as in claim 1, wherein said actual value is digitized into a digital signal using a quantizer.

6. A method as in claim 1, wherein said step of comparing said expected value to said actual value is accomplished using a digital phase-locked loop.

7. A method as in claim 4, wherein said step of applying said correction signal to said other aspect of said electromagnetic wave is accomplished using a bank of pipeline registers.

8. A method as in claim 1, wherein said step of applying said correction signal to said other aspect of said electromagnetic wave is accomplished by compensating for a digital delay.

9. A method as in claim 1, wherein said step of applying said correction signal to said other aspect of said electromagnetic wave is accomplished by determining a digital delay between at least two of said aspects of said electromagnetic wave using a difference in clock periods between at least two of said aspect signals.

10. A method for dynamically correcting a signal being processed, said method comprising the steps of:
  processing an amplitude aspect and a phase aspect of said signal along an amplitude and a phase paths, respectively;
  quantizing said phase aspect of said signal to generate an actual phase value;
  comparing said actual phase value with an expected phase value to determine any delay in an analog portion of said phase path in relation to said amplitude path;
  generating a correction signal based upon said comparison; and using said correction signal to adjust said amplitude aspect of said signal.

11. The method of claim 10, wherein said comparison of said expected value to said actual value is accomplished using a digital phase-locked loop.

12. The method of claim 10, wherein said adjustment of said amplitude aspect of said signal is accomplished using a bank of pipeline registers.

13. The method of claim 10, further comprising the steps of:
determining any delay in a digital portion of said phase path using a difference in clock periods between said amplitude and phase aspects of said signal along said paths;
generating another correction signal; and
using said another correction signal to adjust said amplitude aspect of said signal.

14. The method of claim 13, wherein said adjustment of said amplitude aspect of said signal is accomplished using at least one pipeline register.

15. An apparatus for dynamically correcting a signal comprising:
at least one signal path for processing at least one aspect of said signal;
at least one separate signal path for processing at least one other aspect of said signal;
a correction circuit for generating a digital value of said one aspect along said one signal path, comparing said digital value with an expected value to determine any delay in an analog portion of said signal path relative to said separate signal path, generating a correction signal based upon said comparison, and using said correction signal to adjust said other aspect of said signal.

16. The apparatus of claim 15, wherein said aspects of said signal comprise amplitude and phase information.

17. The apparatus of claim 15, wherein said aspect of said signal that is compared is phase information.

18. The apparatus of claim 15, wherein said comparison circuit comprises a quantizer for generating said digital value of said one aspect.

19. The apparatus of claim 15, wherein said comparison circuit comprises a digital phase-locked loop for comparing said digital value with said expected value.

20. The apparatus of claim 15, wherein said comparison circuit comprises a bank of pipeline registers for adjusting said other aspect of said signal.

21. The apparatus of claim 15, wherein said comparison circuit further comprises a processor for determining any delay in a digital portion of said one path relative to said separate path using a difference in clock periods between said aspects of said signal along said paths, generating another correction signal, and using said another correction signal to adjust said other aspect of said signal.

22. The apparatus of claim 21, wherein said processor comprises at least one pipeline register.

23. An apparatus for dynamically correcting a signal comprising:
at least one signal path for processing the phase of said signal;
at least one separate signal path for processing the amplitude of said signal;
a quantizer for generating a value of said phase along said one signal path;
a digital phase locked loop for comparing said value with an expected value to determine any delay in an analog portion of said one signal path relative to said separate signal path, and to generate a correction signal based upon said comparison; and
a bank of pipeline registers for adjusting said separate signal path.

24. The apparatus of claim 23, further comprising a processor for determining any delay in a digital portion of said one path relative to said separate path using a difference in clock periods along said paths, generating another correction signal, and using said another correction signal to adjust said separate signal path.

25. The apparatus of claim 24, wherein said processor comprises at least one pipeline register.

* * * * *